(12) United States Patent
Kim

(10) Patent No.: US 7,782,698 B2
(45) Date of Patent: Aug. 24, 2010

(54) REFRESH SIGNAL GENERATOR OF SEMICONDUCTOR MEMORY DEVICE

(75) Inventor: Tae-Kyun Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 96 days.

(21) Appl. No.: 11/966,838

(22) Filed: Dec. 28, 2007

(65) Prior Publication Data

US 2008/0247256 A1 Oct. 9, 2008

(30) Foreign Application Priority Data

Apr. 6, 2007 (KR) ........................ 10-2007-0034208

(51) Int. Cl.
*G11C 7/00* (2006.01)

(52) U.S. Cl. .................... 365/222; 365/201; 365/225.7; 365/226

(58) Field of Classification Search ................ 365/211
See application file for complete search history.

(56) References Cited

U.S. PATENT DOCUMENTS

| 5,278,796 | A | * | 1/1994 | Tillinghast et al. ........... 365/211 |
| 5,532,968 | A | | 7/1996 | Lee et al. |
| 5,625,597 | A | | 4/1997 | Hirose |
| 5,625,968 | A | | 5/1997 | Ashall et al. |
| 6,240,019 | B1 | * | 5/2001 | Shiga et al. .............. 365/185.22 |
| 6,618,310 | B2 | * | 9/2003 | Higashiho et al. ........... 365/222 |
| 6,667,925 | B2 | * | 12/2003 | Kobayashi et al. .......... 365/211 |
| 6,756,856 | B2 | * | 6/2004 | Song et al. .................. 331/176 |
| 7,038,968 | B2 | | 5/2006 | Kim |
| 7,512,027 | B2 | * | 3/2009 | Sohn ......................... 365/222 |
| 2005/0105352 | A1 | | 5/2005 | Lee |
| 2005/0228611 | A1 | | 10/2005 | Kim |
| 2006/0066386 | A1 | | 3/2006 | Hong |
| 2006/0083094 | A1 | * | 4/2006 | Sinha et al. ................. 365/222 |
| 2006/0087901 | A1 | | 4/2006 | Hong et al. |

FOREIGN PATENT DOCUMENTS

| JP | 2005-216429 | 8/2005 |
| JP | 2006-004558 | 1/2006 |
| KR | 1019950002723 | 3/1995 |
| KR | 1019950010139 | 9/1995 |
| KR | 1019950010624 | 9/1995 |
| KR | 10200100020894 | 3/2001 |

\* cited by examiner

*Primary Examiner*—Tan T. Nguyen
(74) *Attorney, Agent, or Firm*—IP & T Law Firm PLC

(57) ABSTRACT

A refresh signal generator generates an internal refresh signal to conduct a refresh with an interval controlled based on PVT fluctuations. The refresh signal generator includes a temperature sensing unit for sensing an internal temperature and activating a corresponding signal of a plurality of temperature sensing signals in response to a temperature sense driving signal, a power supply selecting unit for driving a driving voltage supply terminal to one of different voltage levels according to the plurality of temperature sensing signals, and an internal refresh signal generating unit for receiving a driving voltage from the power supply selecting unit and producing internal refresh signals at a constant interval.

23 Claims, 7 Drawing Sheets

REFRESH SIGNAL GENERATOR OF SEMICONDUCTOR MEMORY DEVICE

CROSS-REFERENCE TO RELATED APPLICATIONS

The present application claims priority to Korean patent application number 10-2007-0034208, filed on Apr. 6, 2007, which is incorporated by reference in its entirety.

BACKGROUND OF THE INVENTION

The invention relates to a semiconductor design technology, and more particularly to an internal refresh signal generator for generating an internal refresh signal to conduct a refresh operation with an interval controlled based on PVT fluctuations (Process, Voltage, and Temperature).

Generally, in order that DRAM maintains information in the volatile memory cell, it periodically generates internal refresh signals for the self-refresh operation in a standby state.

When the DRAM is in an operation mode, a refresh should be performed with the external command. Also, when the DRAM is in a standby mode, a self-refresh, in which an internal refresh command is issued itself, should be performed without an external command. Moreover, the refresh operation has to be performed within a retention time which is required to maintain the information stored in the DRAM memory cell.

Typically, the self-refresh command is issued by counting a basic periodic signal (oscillation pulse), which is generated by a basic periodic signal generator, based on division signals. In order to perform the self-refresh operation in the conventional technology, a self-refresh command signal generator is provided within the DRAM and the self-refresh operation is periodically executed by a command form the self-refresh command signal generator.

FIG. 1 is a block diagram illustrating a conventional internal refresh signal generator in a semiconductor memory device. The conventional internal refresh signal generator includes a periodic signal generating unit 10 which receives a driving power and outputs both a basic periodic signal B_OSC and a half periodic signal D_OSC which has a half period of time in comparison with the basic periodic signal B_OSC, a mode selection unit 20 which selects one from the basic periodic signal B_OSC or the half periodic signal D_OSC in response to a period selecting signal DSRF_ON in order to output an unit periodic signal S_OSC, and a refresh signal generating unit 30 which produces the internal refresh signal SRF when divided signals of the unit periodic signal S_OSC are activated for a predetermined time.

The conventional internal refresh signal generator further includes a fuse selection unit 40 which supplies a cycle changing fuse signal OSC_FUSE<0:1> to change a period of the basic periodic signal B_OSC from the periodic signal generating unit 10 and a counting-number adjusting fuse signal SRF_FUSE<0:1> to control a counting number of the unit periodic signal S_OSC in the refresh signal generating unit 30. The period selecting signal DSRF_ON is a value set in the EMRS (Extended Mode Register Set). Moreover, data stored in the semiconductor memory are refreshed by the internal refresh signal SRF. Also, the periodic signal generating unit 10 includes an oscillator and the fuse selecting unit 40 can be implemented by a metal switch, instead of a fuse option.

The operation of the internal refresh generator illustrated in FIG. 1 will be described briefly. First, when the DRAM is in a standby mode, the periodic signal generating unit 10 produces the basic periodic signal B_OSC having a predetermined period and the half periodic signal D_OSC. The half periodic signal D_OSC is correspondent to a signal having a half period of the basic periodic signal B_OSC. The mode selection unit 20 selects one from the basic periodic signal B_OSC and the half periodic signal D_OSC in response to the period selecting signal DSRF_ON. The refresh signal generating unit 40 receives the unit periodic signal S_OSC, divides it, counts the divided signals, and outputs the internal refresh signal SRF in a type of a pulse signal when the counting operation is conducted over a predetermined number.

That is, as to the unit periodic signal S_OSC, the conventional internal refresh signal generator outputs a signal which is selected from the basic periodic signal B_OSC and the half periodic signal D_OSC based on the set value in the EMRS. The internal refresh signal SRF is produced by counting the unit periodic signal S_OSC based on the predetermined division. Therefore, the internal refresh signal SRF is periodically produced. Moreover, the period of the basic periodic signal B_OSC or the half periodic signal D_OSC can be adjusted by the fuse selecting unit 40 in compliance with the PVT fluctuations and the division of the unit periodic signal S_OSC can be also adjusted in the refresh signal generating unit 30.

For example, in the case where the temperature rises, the data storage time (Retention Time) of the memory cell of DRAM is decreased. Therefore, in order to prevent the data from being lost, a refresh has to be more frequently done in comparison with the common circumstance. Accordingly, in the specification prescribed in the DRAM, the EMRS sets a refresh interval over a specific temperature in order that the refresh is conducted for a period twice as much as the common refresh at a room temperature. That is, the refresh at the high temperature is frequently performed twice as much as that at the room temperature. On the other hand, in the case of the above-described conventional self-refresh, since a mask revision has to be carried out for changing the fuse option, an additional cost and time are needed. Besides, since only two cases of the room temperature and the high temperature are considered in the self-refresh operation, an excessive refresh can be performed even though it is under the high temperature situation.

Concretely, a physical experiment, such as a change of the metal switch or a metal fuse cutting, has to be verified in order that the self-refresh is in compliance with the variation of the processes. Particularly, the metal switch has to be verified through a mask revision because the metal switch is made of lower layers of a plurality of metal layers.

Further, as to the temperature variation, the conventional self-refresh operation produces an internal refresh signal for the self-refresh driving in consideration of data storage time of the DRAM memory cell at a room temperature. However, since a half period mode is used with EMRS above the specific temperature, the retention time of the memory cell is unable to be actually reflected at the high temperature. As a result, the self-refresh operation has to be executed with an excessively short cycle in consideration of the margin. That is, since the refresh cycle adjusted by the EMRS mode cannot actually reflect the temperature within the DRAM, a failure to conduct the refresh operation is caused by using the basic periodic signal at a specific high temperature or the self-refresh operation of the excessively short cycle is caused by using the half periodic signal at a low high temperature.

Finally, as to the power source voltage, the DRAM uses internal voltages which are relatively lower than an external voltage. The reason why the low internal voltage is used is that it has an effect on a signal delay with a low supply voltage of the periodic signal generator because the cycle of the self-refresh is relatively short (a few tens of microseconds). However, it is further necessary to cope with a low level of the supply voltage because the external voltage of DRAM is continuously decreased in advance.

SUMMARY OF THE INVENTION

Embodiments of the invention are directed to providing an internal refresh signal generator for generating an internal refresh signal to conduct a refresh with an interval controlled based on PVT fluctuations.

In accordance with an aspect of the invention, there is provided an apparatus for generating refresh signals, which includes a temperature sensing unit configured to sense an internal temperature and activate a corresponding signal of a plurality of temperature sensing signals in response to a temperature sense driving signal, a power supply selecting unit configured to drive a driving voltage supply terminal to one of different voltage levels according to the plurality of temperature sensing signals, and an internal refresh signal generating unit configured to receive a driving voltage from the power supply selecting unit and produce internal refresh signals at a constant interval.

In accordance with another aspect of the invention, there is provided an apparatus for generating refresh signals, which includes a power supply selecting unit configured to drive a driving voltage supply terminal to one of different voltage levels according to a plurality of test selection signals and fuse cutting information signals, and an internal refresh signal generating unit configured to receive a driving voltage from the power supply selecting unit and produce internal refresh signals at a constant interval.

In accordance with a further aspect of the invention, there is provided an apparatus for generating refresh signals, which includes a temperature sensing unit sensing an internal temperature and configured to activate a corresponding signal of a plurality of temperature sensing signals in response to a temperature sense driving signal, a power supply selecting unit configured to drive a driving voltage supply terminal to one of different voltage levels according to the plurality of temperature sensing signals, test selection signals or fuse cutting information signals, and an internal refresh signal generating unit configured to receive a driving voltage from the power supply selecting unit and produce internal refresh signals at a constant interval.

DESCRIPTION OF SPECIFIC EMBODIMENTS

Hereinafter, a semiconductor memory device in accordance with the invention will be described in detail referring to the accompanying drawings.

Figure 1:
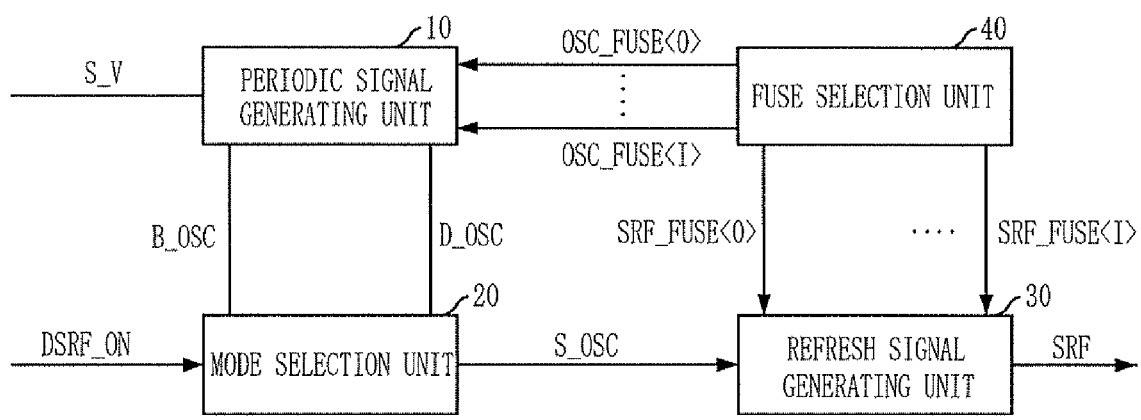
FIG. 1 is a block diagram illustrating a conventional internal refresh signal generator in a semiconductor memory device.
Figure 2:
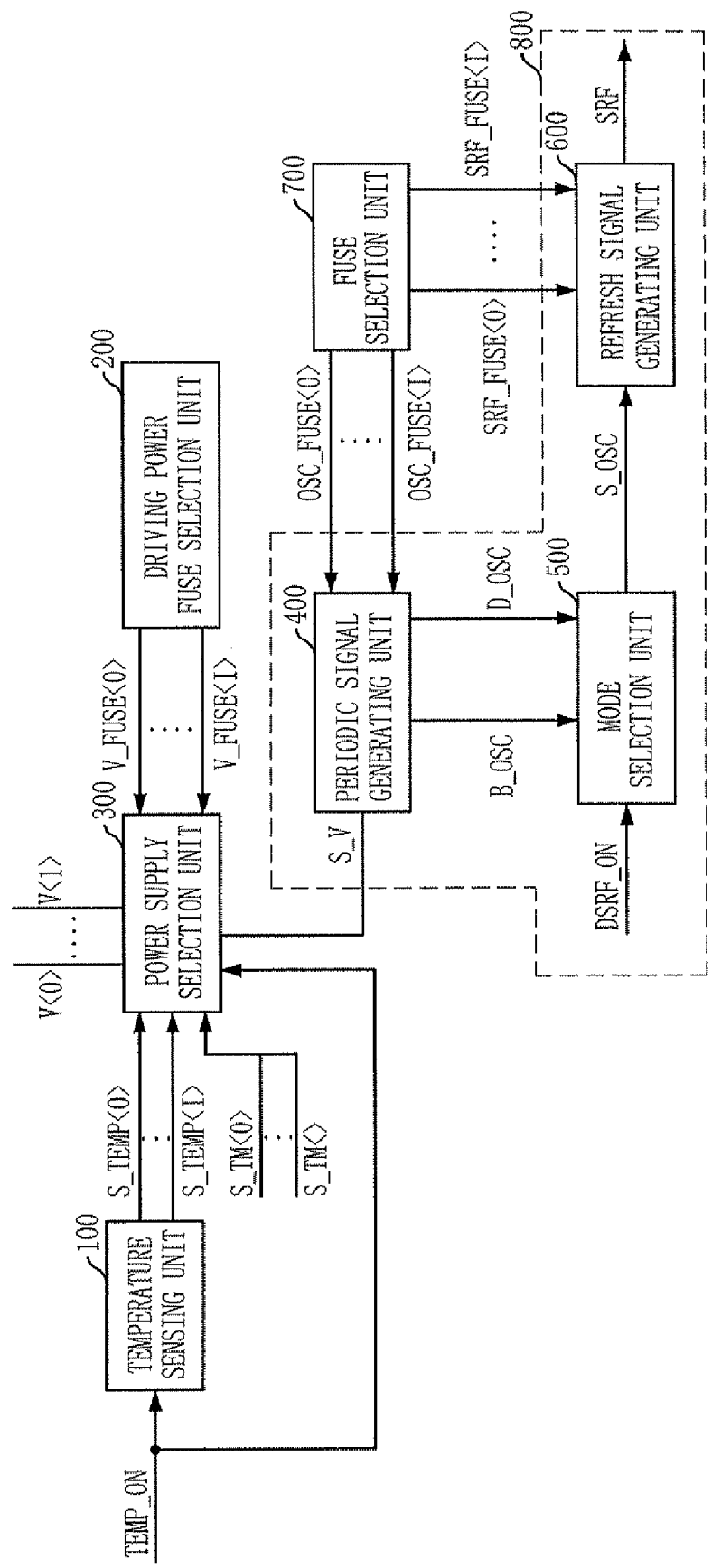
FIG. 2 is a block diagram illustrating an internal refresh signal generator in a semiconductor memory device according to one embodiment of the invention.

FIG. 2 is a block diagram illustrating an internal refresh signal generating apparatus in a semiconductor memory device according to one embodiment of the invention. Referring to FIG. 2, the internal refresh signal generating apparatus includes a temperature sensing unit 100 for sensing an internal temperature in response to an temperature sense driving signal TEMP_ON and activating a corresponding signal of a plurality of temperature sensing signals S_TEMP<0:I>, a power supply selection unit 300 for driving a driving voltage supply terminal S_V to one of the plurality of different voltage levels based on the plurality of the temperature sensing signals S_TEMP<0:I>, test selection signals S_TM<0:I> or fuse cuffing information signals V_FUSE<0:I>, and a refresh signal generating unit 800 for receiving a driving voltage from the driving voltage supply terminal S_V and producing an internal refresh signal SRF with a predetermined interval.

The refresh signal generating unit 800 includes a periodic signal generating unit 400 for producing a basic periodic signal B_OSC and a half periodic signal D_OSC which is correspondent to a signal having a half period of the basic periodic signal B_OSC, a mode selection unit 500 for selectively outputting one from the basic periodic signal B_OSC and the half periodic signal D_OSC in response to a period selecting signal DSRF_ON in order to output an unit periodic signal S_OSC, and a refresh signal generating unit 600 for producing an internal refresh signal SRF in response to the unit periodic signal S_OSC.

The internal refresh signal generating apparatus according to the invention controls the voltage level of the driving power, which is applied to the periodic signal generating unit 400, through a fuse option or the test selection signals S_TM<0:I> based on the internal temperature. The lower the voltage level of the driving power is, the longer the cycle of each of the basic periodic signal B_OSC and the half periodic signal D_OSC which are produced by the periodic signal generating unit 400 is. Accordingly, the invention controls the refresh interval by producing the different basic periodic signals B_OSC and half periodic signals D_OSC.

The internal refresh signal generating apparatus according to one embodiment of the invention further includes a fuse selection unit 700 for supplying period changing fuse signals OSC_FUSE<0:I> to change the period of time of the basic periodic signal B_OSC and the half periodic signal D_OSC from the periodic signal generating unit 400 based on the PVT fluctuations and a counting-number adjusting fuse signal SRF_FUSE<0:I> to control a counting number of the unit periodic signal S_OSC in the refresh signal generating unit 600 and also includes a driving power fuse selection unit 200 for supplying the fuse cutting-information signal V_FUSE<0:I>.

Figure 3:
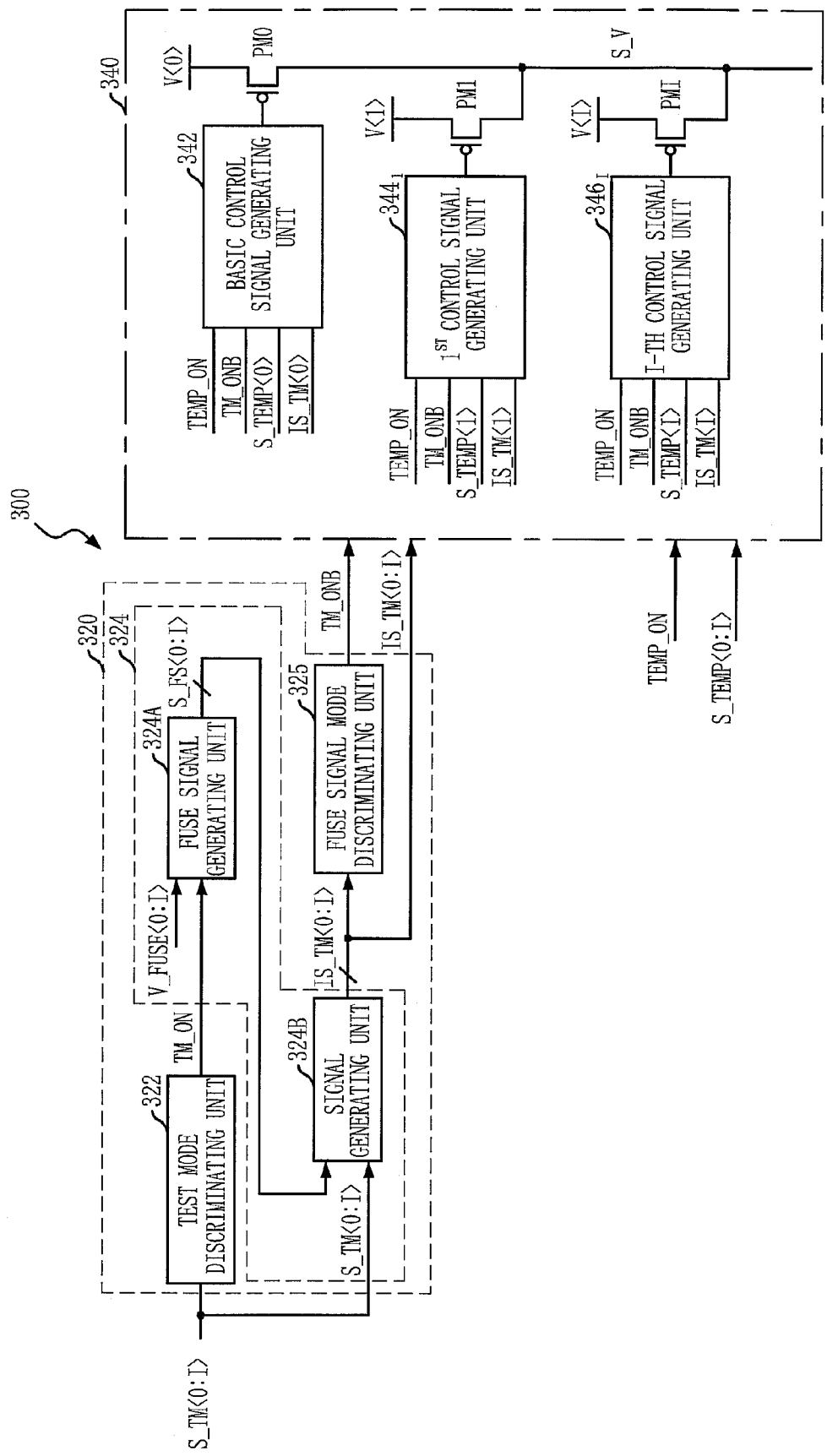
FIG. 3 is a circuit diagram illustrating a power supply selection unit of FIG. 2.

Referring to FIG. 3, the power supply selection unit 300 of FIG. 2 includes an internal driving control unit 320 for producing the plurality of internal selection signals IS_TM<0:I> having information about the plurality of the test selection signals S_TM<0:I> and the fuse cutting-information signals V_FUSE<0:I> and an internal mode status signal TM_ONB indicative of the input of the two signals, and a power supply unit 340 for driving the driving voltage supply terminal S_V using one of the different voltage levels based on the internal mode status signal TM_ONB, the temperature sense driving signal TEMP_ON, the plurality of the temperature-sensing signals S_TEMP<0:I> and the plurality of the internal selection signals IS_TM<0:I>.

The power supply unit 340 includes a plurality of drivers $PM_0$ to $PM_I$ for driving the driving voltage supply terminal S_V to a corresponding voltage level, a plurality control signal generating units $344_1$ and $344_I$ for respectively controlling the corresponding drivers based on the internal mode status signal TM_ONB, the temperature sense driving signal TEMP_ON, the plurality of the temperature-sensing signals S_TEMP<1:I> and the plurality of the internal selection signals IS_TM<1:I>, and a basic control signal generating unit 342 for controlling the driver $PM_0$ based on the internal mode status signal TM_ONB, the temperature sense driving signal TEMP_ON, the temperature sensing signal S_TEMP<0> and the internal selection signals IS_TM<0>. At this time, the basis control signal generating unit 342 drives the driver $PM_0$ when the temperature sense driving signal TEMP_ON and the internal mode status signal TM_ONB are inactivated and this operation will be described in detail below.

Referring again to FIG. 3, the internal driving control unit 320 includes a test mode discriminating unit 322 for producing a test mode status signal TM_ON indicative of the input of the plurality of the test selection signals S_TM<0:I>, an internal signal generating unit 324 for receiving the plurality of the fuse cutting information signals V_FUSE<0:I> or the plurality of the test selection signals S_TM<0:I> and outputting the internal selection signals IS_TM<0:I> in response to the test mode status signal TM_ON, and a fuse signal mode discriminating unit 325 for producing the internal mode status signal TM_ONB indicative of the input of the plurality of the internal selection signals IS_TM<0:I>.

The internal signal generating unit 324 includes a fuse signal generating unit 324A for outputting fuse selection signals S_FS<0:I> corresponding to the plurality of the fuse cutting information signals V_FUSE<0:I> when the test mode status signal TM_ON is inactivated, and a signal generating unit 324B for outputting the plurality of internal selection signals IS_TM<0:I> having information about the plurality of the fuse selection signals S_FS<0:I> and the test selection signals S_TM<0:I>.

Figure 4:
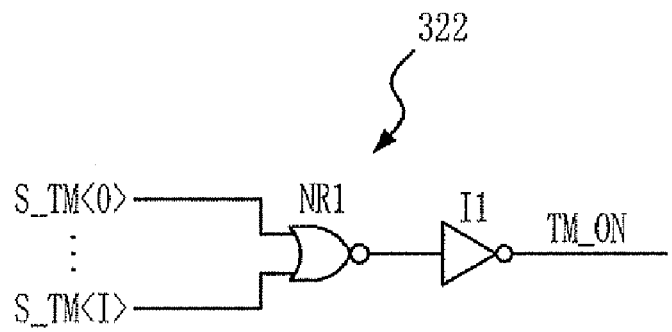
FIG. 4 is a circuit diagram illustrating a test mode discriminating unit of FIG. 3.

Referring to FIG. 4, the test mode discriminating unit 322 of FIG. 3 includes a NOR gate NR1 for performing a NOR operation of the plurality of the test selection signals S_TM<0:I> and an inverter I1 for inverting an output signal of the NOR gate NR1 to output the test mode status signal TM_ON.

The test mode discriminating unit 322 activates the test mode status signal TM_ON to a high level when at least one of the plurality of the test selection signals S_TM<0:I> is activated. That is, the test mode status signal TM_ON functions as a flag signal indicative of an input of the test selection signals S_TM<0:I>.

Figure 5:
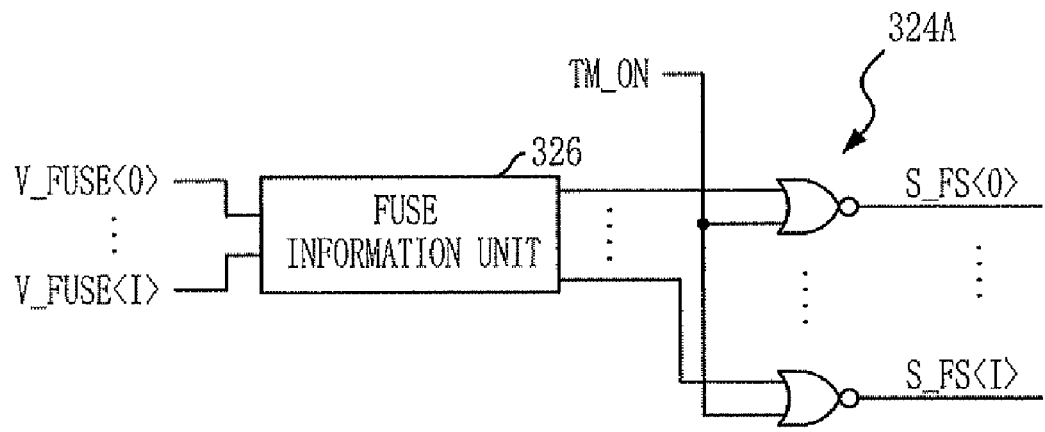
FIG. 5 is a circuit diagram illustrating a fuse signal generating unit of FIG. 3.

Referring to FIG. 5, the fuse signal generating unit 324A includes a fuse information unit 326 for outputting signals which are respectively correspondent to the plurality of the fuse cutting information signals V_FUSE<0:I> and a plurality of NOR gates for respectively performing a NOR operation of the signal from the fuse information unit 326 and the test mode status signal TM_ON in order to output the corresponding fuse selection signals S_FS<0:I>.

The fuse information unit 326 outputs the signals according to the voltage levels of the fuse cutting information signals V_FUSE<0:I> and the plurality of the NOR gates output the corresponding fuse selection signals S_FS<0:I> to a high level according to the corresponding output signal of the fuse information unit 326 when the test mode status signal TM_ON is inactivated. That is, the fuse signal generating unit 324A inactivates all the fuse selection signals S_FS<0:I> to a low level regardless of the fuse cutting information signals V_FUSE<0:I> when the test mode status signal TM_ON is activated. On the contrary, the fuse signal generating unit 324A activates to a high level the fuse selection signals S_FS<0:I> which are correspondent to the fuse cutting information signals V_FUSE<0:I> when the test mode status signal TM_ON is inactivated. That is, the fuse signal generating unit 324A outputs the fuse selection signals S_FS<0:I> corresponding to the fuse cutting information signals V_FUSE<0:I> only when all the test selection signals S_TM<0:I> are not applied to the test mode discriminating unit 322 and then the test mode status signal TM_ON is deactivated.

Figure 6:
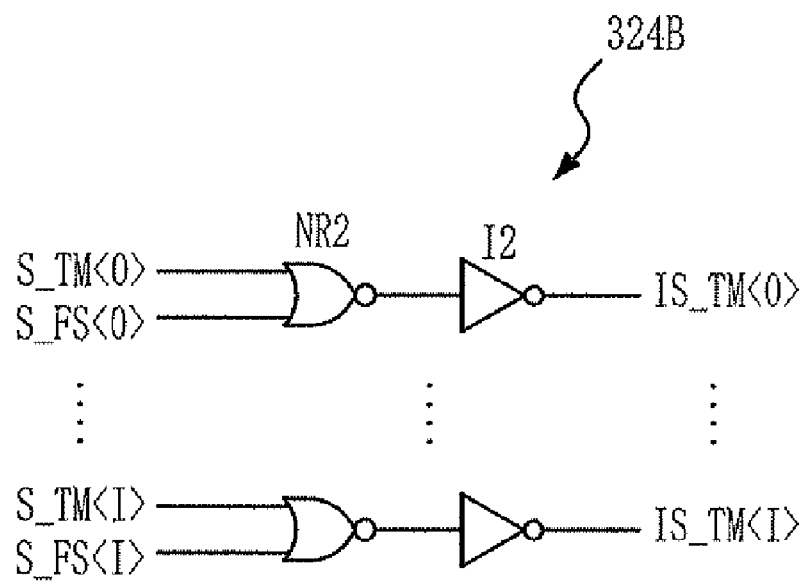
FIG. 6 is a circuit diagram illustrating a signal generating unit of FIG. 3.

Referring to FIG. 6, the signal generating unit 324B includes a plurality of NOR gates NR2 each of which receives one of the plurality of the fuse selection signals S_FS<0:I> and one of the plurality of the test selection signals S_TM<0:I>, and a plurality of inverters I2 for respectively inverting the output signals of the NOR gates NR2 in order to output the corresponding internal selection signals IS_TM<0:I>.

For example, the signal generating unit 324B activates the internal selection signal IS_TM<0> to a high level with the activation of the fuse selection signal S_FS<0> or the test selection signal S_TM<0> and also activates the internal selection signal IS_TM<1> to a high level with the activation of the fuse selection signal S_FS<1> or the test selection signal S_TM<1>. That is, the signal generating unit 324B produces the internal selection signal IS_TM<0:I> having information about the input of the fuse selection signal S_FS<0:I> at the test mode or information about the input of the test selection signal S_TM<0:I> through the fuse option.

However, as shown in FIG. 5, since the fuse selection signals S_FS<0:I> are activated in the case where the test selection signals S_TM<0:I> are not applied to the test mode discriminating unit 322 and then the test mode status signal TM_ON is inactivated, the internal selection signals IS_TM<0:I> are first determined by the test selection signals S_TM<0:I>. When the test selection signals S_TM<0:I> are not applied to the test mode discriminating unit 322, the internal selection signals IS_TM<0:I> have the information about the fuse selection signals S_FS<0:I>. In other words, the internal selection signals IS_TM<0:I> are activated by the internal signals, such as the test selection signals S_TM<0:I> and the fuse selection signals S_FS<0:I>. At this time, the internal selection signals IS_TM<0:I> are first activated by the test selection signals S_TM<0:I> and subsequently activated by the fuse selection signals S_FS<0:I>.

Figure 7:
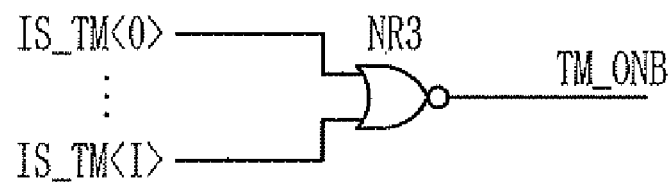
FIG. 7 is a circuit diagram illustrating a fuse signal mode discriminating unit of FIG. 3.

Referring to FIG. 7, the fuse signal mode discriminating unit 325 includes a NOR gate NR3 for outputting the internal mode status signal TM_ONB by receiving the plurality of internal selection signals IS_TM<0:I>. Accordingly, the fuse signal mode discriminating unit 325 activates the internal mode status signal TM_ONB to a low level when one of the plurality of internal selection signals IS_TM<0:I> is activated. The internal mode status signal TM_ONB is inactivated to a high level only when all the internal selection signals IS_TM<0:I> are inactivated. That is, the internal mode status signal TM_ONB functions as a flag signal indicative of the activation of the internal signal, such as the test selection signals S_TM<0:I> or the fuse cutting information signals V_FUSE<0:I>.

Figure 8:
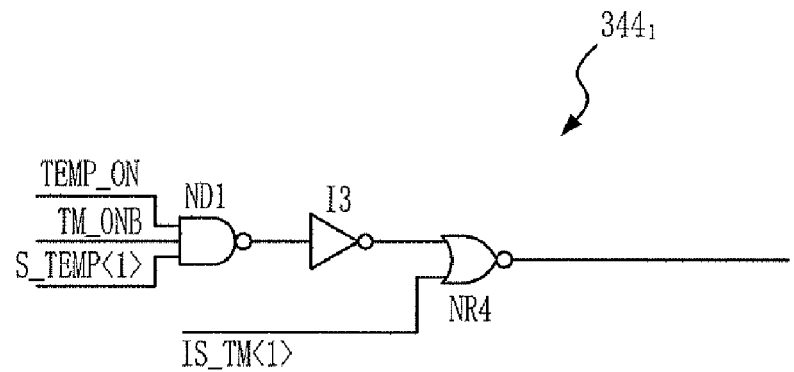
FIG. 8 is a circuit diagram illustrating a first control signal generating unit of FIG. 3.

FIG. 8 is a circuit diagram illustrating the first control signal generating unit $344_1$ of FIG. 3. The first to I-th control signal generating units $344_1$ and $344_1$ have the same scheme so that only the first control signal generating unit $344_1$ will be illustrated below.

Referring to FIG. 8, the first control signal generating unit $344_1$ includes a NAND gate ND1 for NANDing the internal mode status signal TM_ONB, the temperature sense driving signal TEMP_ON and the corresponding temperature sense signal S_TEMP<1>, an inverter I3 for inverting an output signal of the NAND gate ND1, and a NOR gate NR4 for NORing an output signal of the inverter I3 and the corresponding internal selection signal IS_TM<1> and outputting a first driving control signal.

In the first control signal generating unit $344_1$, in the case where the temperature sense driving signal TEM_ON is activated, the internal mode status signal TM_ONB is deactivated to a high level and the corresponding temperature sense signal S_TEMP<1> is activated, the first driving control signal is activated to a high level. Moreover, in the case where the internal selection signal IS_TM<1> is activated, the first driving control signal is activated.

In other words, the first driving control signal is first activated by the internal selection signal IS_TM<1> and it is activated based on the activation of the temperature sense signal S_TEMP<1> in the case where the internal selection signal IS_TM<1> is not applied to the NOR gate NR4. As to the influence of the order of the input signals on the activation of the first drive control signal, the internal selection signal IS_TM<1> is prior to the temperature sense signal S_TEMP<1>. At this time, the internal selection signal is first determined by the test selection signal and thereafter determined by the fuse cutting information. Therefore, the first driving control signal is first determined by the test selection signal and subsequently determined by the fuse cutting-information signal and the temperature sense signal in this order.

The first to I-th control signal generating units $344_1$ to $344_1$ have the same scheme except for the corresponding input signals of the temperature sense signals S_TEMP<0:I> and the internal selection signals IS_TM<0:I>. Moreover, referring again to FIG. 3, the driver $PM_1$ includes a PMOS transistor which has a gate to receive the first driving control signal from the first control signal generating unit $344_1$ and a source-drain connection between a voltage supply V<1> and the driving voltage supply terminal S_V.

Figure 9A:
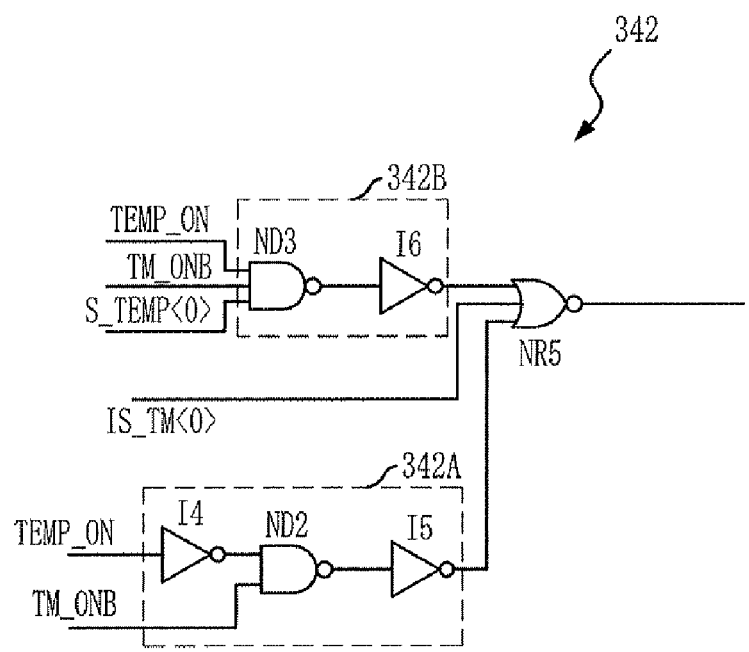
FIG. 9A is a circuit diagram illustrating a basis control signal generating unit of FIG. 3 according to a preferred embodiment.

FIG. 9a is a circuit diagram illustrating the basis control signal generating unit of FIG. 3 according to a preferred embodiment. Referring to FIG. 9a, the basic control signal generating unit 342 includes a default setting unit 342A for producing a default sensing signal in the deactivation of the internal mode status signal TM_ONB and the temperature sense driving signal TEMP_ON, a NAND gate ND3 for performing a NAND operation of the internal mode status signal TM_ONB, the temperature sense driving signal TEMP_ON and the corresponding temperature sense signal S_TEMP<0>, an inverter I6 for inverting an output signal of the NAND gate ND3, and a NOR gate NR5 for performing a NOR operation of an output signal of the inverter I6, the corresponding internal selection signal IS_TM<0> and the default sensing signal and outputting a basic driving control signal.

The default setting unit 342A includes an inverter I4 for inverting the temperature sense driving signal TEMP_ON, a NAND gate ND2 for performing a NAND operation of an output signal of the inverter I4 and the internal mode status signal TM_ONB, and an inverter I5 for inverting an output signal of the NAND gate ND2 and outputting the default sensing signal.

As compared with the first control signal generating unit $344_1$ of FIG. 8, the basic control signal generating unit 342 additionally includes the default setting unit 342A and the output signal of the default setting unit 342A is further inputted to the NOR gate NR5.

The default setting unit 342A activates the default sensing signal to a high level when both the temperature sense driving signal TEMP_ON and the internal mode status signal TM_ONB are inactivated. That is, the default setting unit 342A senses the case in which the temperature sensing unit 100 is not driven and the fuse option or the internal signal is not set up, thereby activating the default sensing signal and then activating the basic driving control signal to a low level.

Also, in similar to the first control signal generating unit $344_1$, in the case where the temperature sense driving signal TEMP_ON or the internal mode status signal TM_ONB is activated, the basic driving control signal is activated according to the temperature sensing signal S_TEMP<0> or the internal selection signal IS_TM<0>.

Figure 9B:
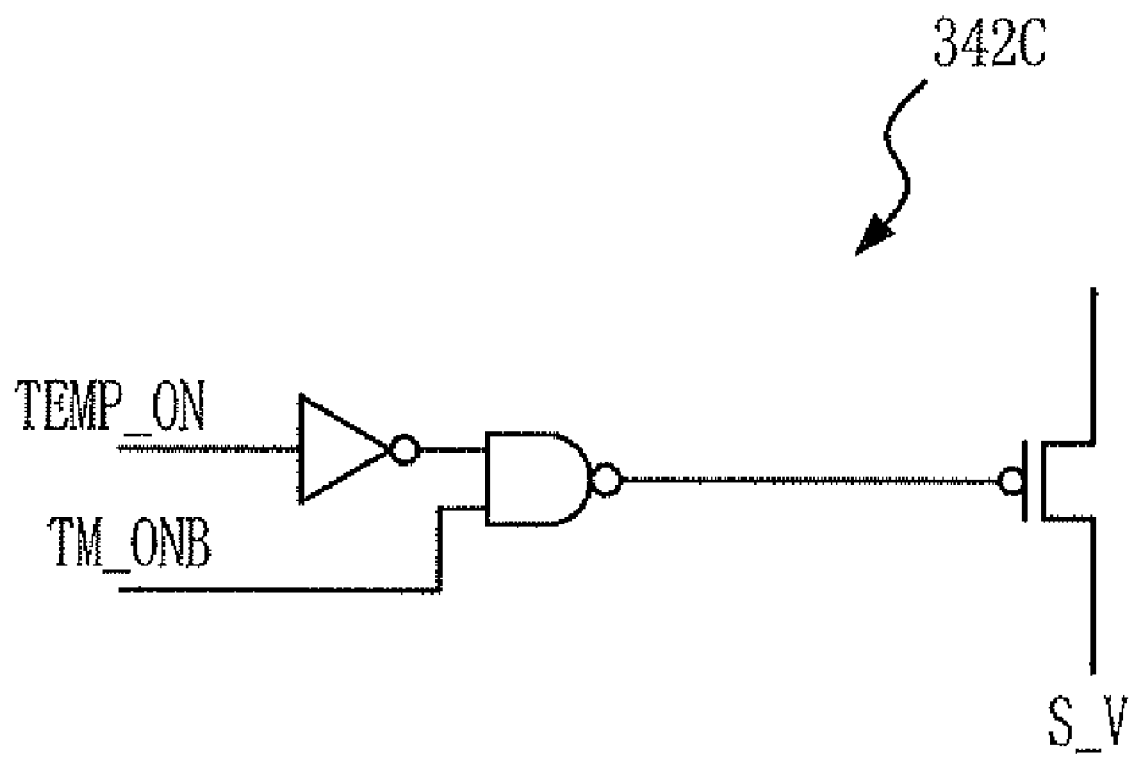
FIG. 9B is a circuit diagram illustrating the basis control signal generating unit of FIG. 3 according to another preferred embodiment.

Referring again to FIG. 3, the driver $PM_0$ includes a PMOS transistor which has a gate to receive the basic driving control signal from the basic control signal generating unit 342 and a source-drain connection between a voltage supply V<0> and the driving voltage supply terminal S_V. On the other hand, FIG. 9b is a circuit diagram illustrating the basis control signal generating unit of FIG. 3 according to another preferred embodiment. As compared with that of FIG. 9a, the basis control signal generating unit 342C has the same scheme as the default setting unit 342A. That is, the basis control signal generating unit 342C supplies the power supply voltage V<0> to the driving voltage supply terminal S_V by activating the basis driving control signal in the default situation in which the temperature sensing signals S_TEMP<0:I>, the fuse cutting information signals V_FUSE<0:I> and the internal signals S_TM<0:I> are not applied thereto.

Therefore, the above-described invention controls the internal refresh interval through the different basic periodic signals B_OSC and half periodic signals D_OSC, by controlling the voltage level of the supplied driving power based on the ambient temperature or a selection. The voltage levels of the driving power is first determined by the test selection signal and subsequently determined by the fuse cutting information signal and the temperature-sensing signal in this order.

In the invention, it is possible to change the period of the self-refresh command SRF using the test mode before the physical experiment and to conduct a refresh optimized to the retention time of the memory device at a high temperature. That is, the invention can make a measurement fast and control the memory self-refresh duty cycle, as compared with the conventional techniques. Therefore, the current consumption, which is caused by the excessively frequent self-refresh, can be prevented. Besides, since the temperature sensing unit is included in the invention, the internal refresh signals having different periodic signals, which are in compliance with the retention time of the DRAM memory cell, can be provided based on the temperature fluctuation. Finally, in the case where the low level power supply is employed in the DRAM memory, the decrease of the voltage level for the refresh can be prevented by making it possible to use different voltage levels.

Meanwhile, in the invention, the refresh cycle is controlled based on the temperature sensing unit, the fuse option, and the test mode; however, two of these three factors can be used to obtain the similar or same effects.

While the invention has been described with respect to the particular embodiments, it will be apparent to those skilled in the art that various changes and modifications may be made without departing from the spirit and scope of the invention as defined in the following claims.

What is claimed is:

1. An apparatus for generating refresh signals, comprising:
   a temperature sensing unit configured to sense an internal temperature and activate a corresponding signal of a plurality of temperature sensing signals in response to a temperature sense driving signal;
   a power supply selecting unit configured to drive a driving voltage supply terminal to one of different voltage levels according to the plurality of temperature sensing signals and a plurality of test selection signals; and
   an internal refresh signal generating unit configured to receive a driving voltage from the driving voltage supply terminal and produce internal refresh signals at a predetermined interval that is controlled based on a voltage level of the driving voltage.

2. The apparatus of claim 1, wherein the power supply selecting unit includes:
   a first driver driving the driving voltage supply terminal to a first supply voltage in response to an inactivation of the temperature sense driving signal; and
   second to I-th drivers each driving the driving voltage supply terminal to one of different supply voltages in response to a corresponding signal of the plurality of temperature sensing signals.

3. The apparatus of claim 2, wherein the internal refresh signal generating unit includes:
   a periodic signal generating unit producing a basic periodic signal and a half periodic signal corresponding to a signal having a half period of the basic periodic signal, by receiving a driving voltage from the driving voltage supply terminal;
   a mode selection unit configured to output a unit periodic signal by selecting the basic periodic signal or the half periodic signal in response to a period selecting signal; and
   a refresh signal generating unit configured to produce the internal refresh signals in response to the unit periodic signal.

4. The apparatus of claim 3, wherein each of the second to I-th drivers includes a PMOS transistor having a gate to receive the corresponding temperature sensing signal and a source-drain connection between the driving voltage supply terminal and one of different supply voltage terminals.

5. The apparatus of claim 4, wherein the first driver includes a PMOS transistor having a gate to receive the temperature sense driving signal and a source-drain connection between a first supply voltage terminal and the driving voltage supply terminal.

6. An apparatus for generating refresh signals comprising:
   a power supply selecting unit configured to drive a driving voltage supply terminal to one of different voltage levels according to a plurality of test selection signals and fuse cuffing information signals; and
   an internal refresh signal generating unit configured to receive a driving voltage from the driving voltage supply terminal and produce internal refresh signals at a predetermined interval that is controlled based on a voltage level of the driving voltage.

7. The apparatus of claim 6, wherein the power supply selecting unit includes:
   an internal driving control unit configured to receive the plurality of the test selection signals and the fuse cuffing information signals and produce a plurality of internal selection signals and an internal mode status signal; and
   a power supply unit configured to drive the driving voltage supply terminal to one of the different voltage levels according to the internal mode status signal and the plurality of the internal selection signals.

8. The apparatus of claim 7, wherein the internal driving control unit includes:
   a test mode discriminating unit configured to receive the plurality of the test selection signals and produce a test mode status signal;
   an internal signal generating unit configured to output the plurality of the fuse cuffing information signals or the plurality of the test selection signals as the internal selection signals in response to the test mode status signal; and
   a fuse signal mode discriminating unit configured to receive the plurality of the internal selection signals and produce the internal mode status signal.

9. The apparatus of claim 8, wherein the test mode discriminating unit includes:
   a first NOR gate configured to perform a NOR operation of the plurality of the test selection signals; and
   a first inverter configured to invert an output signal of the first NOR gate to output the test mode status signal.

10. The apparatus of claim 8, wherein the internal signal generating unit includes:
    a fuse signal generating unit configured to output the plurality of fuse cutting information signal as a plurality of fuse selection signals in response to the test mode status signal; and
    a signal generating unit configured to receive the plurality of the fuse selection signals and the test selection signals and output the plurality of the internal selection signals.

11. The apparatus of claim 10, wherein the fuse signal generating unit includes:
    a Rise information unit configured to output signals corresponding to the plurality of the fuse cutting information signals, respectively; and
    a plurality of NOR gates each of which performs a NOR operation of one of a plurality of the signals outputted from the fuse information unit and the test mode status signal in order to output a corresponding signal of the plurality of fuse selection signals.

12. The apparatus of claim 10, wherein the signal generating unit includes:
    a plurality of NOR gates each of which receives one of the plurality of the fuse selection signals and one of the plurality of the test selection signals; and
    a plurality of inverters configured to output the corresponding internal selection signals by inverting output signals of the NOR gates, respectively.

13. The apparatus of claim 7, wherein the power supply unit includes:
    first to I-th drivers driving the driving voltage supply terminal to one of first to I-th supply voltages;
    a first control signal generating unit configured to drive the driving supply terminal to the first supply voltage when the internal mode status signal is inactivated; and
    second to I-th control signal generating units configured respectively to control the second to I-th drivers in response to the plurality of the internal selection when the internal mode status signal is activated.

14. The apparatus of claim 13, wherein the first driver includes a PMOS transistor having a gate to receive an inverted signal of the internal mode status signal and a source-drain connection between a first supply voltage terminal and the driving voltage supply terminal.

15. The apparatus of claim 6, wherein the internal refresh signal generating unit includes:
a periodic signal generating unit configured to produce a basic periodic signal, and a half periodic signal corresponding to a signal having a half period of the basic periodic signal, by receiving the driving voltage from the driving voltage supply terminal;
a mode selection unit configured to output an unit periodic signal by selecting the basic periodic signal or the half periodic signal in response to a period selecting signal; and
a refresh signal generating unit configured to produce the internal refresh signals in response to the unit periodic signal.

16. An apparatus for generating refresh signals comprising:
a temperature sensing unit sensing an internal temperature and configured to activate a corresponding signal of a plurality of temperature sensing signals in response to a temperature sense driving signal;
a power supply selecting unit configured to drive a driving voltage supply terminal to one of different voltage levels according to the plurality of temperature sensing signals, test selection signals or fuse cutting information signals; and
an internal refresh signal generating unit configured to receive a driving voltage from the driving voltage supply terminal and produce internal refresh signals at a predetermined interval that is controlled based on a voltage level of the driving voltage.

17. The apparatus of claim 16, wherein the power supply selecting unit includes:
an internal driving control unit configured to receive the plurality of the test selection signals and the fine cutting information signals and produce a plurality of internal selection signals and an internal mode status signal; and
a power supply unit configured to drive the driving voltage supply terminal to one of the different voltage levels according to the plurality of temperature sensing signals and the internal selection signals in response to the internal mode status signal and the temperature sensing signals.

18. The apparatus of claim 17, wherein the internal driving control unit includes:
a test mode discriminating unit configured to receive the plurality of the test selection signals and produce a test mode status signal;
an internal signal generating unit configured to output the plurality of the fuse cutting information signals or the plurality of the test selection signals as the internal selection signals in response to the test mode status signal; and a fuse signal mode discriminating unit configured to receive the plurality of the internal selection signals and produce the internal mode status signal.

19. The apparatus of claim 18, wherein the internal signal generating unit includes:
a fuse signal generating unit configured to output the plurality of fuse cutting information signal as a plurality of the fuse selection signals in response to the test mode status signal; and
a signal generating unit configured to receive the plurality of the fuse selection signals and the test selection signals and output the plurality of the internal selection signals.

20. The apparatus of claim 19, wherein the test mode discriminating unit includes:
a first NOR gate configured to perform a NOR operation on the plurality of the test selection signals; and
a first inverter configured to invert an output signal of the first NOR gate to output the test mode status signal.

21. The apparatus of claim 20, wherein the fuse signal generating unit includes:
a fuse information unit configured to output signals corresponding to the plurality of the fuse cutting information signals, respectively; and
a plurality of NOR gates each of which performs a NOR operation on one of a plurality of signals outputted from the fuse information unit and the test mode status signal in order to output a corresponding signal of the plurality of the fuse selection signals.

22. The apparatus of claim 21, wherein the power supply unit includes:
first to I-th drivers each of which drives the driving voltage supply terminal to a corresponding voltage level;
a first control signal generating unit configured to control the first driver by receiving the internal mode status signal, the temperature sense driving signal and corresponding signals of the temperature sensing signals and the internal selection signals; and
second to I-th control signal generating units configured respectively to control the second to I-th drivers by receiving the inter-mode status signal, the temperature sense driving signal, the plurality of the temperature sensing signals and the internal selection signals.

23. The apparatus of claim 22, wherein the first control signal generating unit includes:
a default setting unit configured to produce a default sensing signal by receiving the temperature sense driving signal and the internal mode status signal;
a first NAND gate configured to perform a NAND operation on the internal mode status signal, the temperature sense driving signal and a corresponding signal of the temperature sense signals;
a second inverter configured to invert an output signal of the first NAND gate; and
a fourth NOR gate configured to perform a NOR operation on an output signal of the second inverter, a corresponding internal selection signal and the default sensing signal and output a basic driving control signal to control the first driver.

* * * * *